United States Patent
Tal et al.

(10) Patent No.: US 10,553,786 B2
(45) Date of Patent: Feb. 4, 2020

(54) MAGNETO-RESISTANCE DEVICE INCLUDING CONJUGATED MOLECULE

(71) Applicant: YEDA RESEARCH AND DEVELOPMENT CO. LTD., Rehovot (IL)

(72) Inventors: Oren Tal, Rehovot (IL); David Rakhmilevich, Rehovot (IL)

(73) Assignee: YEDA RESEARCH AND DEVELOPMENT CO. LTD., Rehovot (IL)

( * ) Notice: Subject to any disclaimer, the term of this patent is extended or adjusted under 35 U.S.C. 154(b) by 180 days.

(21) Appl. No.: 15/507,254

(22) PCT Filed: Aug. 27, 2015

(86) PCT No.: PCT/IL2015/050863
§ 371 (c)(1),
(2) Date: Feb. 28, 2017

(87) PCT Pub. No.: WO2016/030896
PCT Pub. Date: Mar. 3, 2016

(65) Prior Publication Data
US 2017/0288134 A1     Oct. 5, 2017

Related U.S. Application Data

(60) Provisional application No. 62/042,875, filed on Aug. 28, 2014.

(51) Int. Cl.
*H01L 43/08*     (2006.01)
*G11B 5/39*     (2006.01)
(Continued)

(52) U.S. Cl.
CPC ............ *H01L 43/08* (2013.01); *G11B 5/3906* (2013.01); *G11B 5/3909* (2013.01); *G11C 11/15* (2013.01);
(Continued)

(58) Field of Classification Search
None
See application file for complete search history.

(56) References Cited

U.S. PATENT DOCUMENTS 6,730,395 B2 * 5/2004 Covington ............. B82Y 10/00
257/E21.665
8,795,856 B2 * 8/2014 Kaiju ...................... C23C 14/20
427/123
(Continued)

FOREIGN PATENT DOCUMENTS

WO    WO 2013/062617 A1    5/2013

OTHER PUBLICATIONS

Acene wikipedia entry (Year: 2019).*
(Continued)

*Primary Examiner* — Kevin M Bernatz
(74) *Attorney, Agent, or Firm* — Mark S. Cohen; Pearl Cohen Zedek Latzer Baratz LLP

(57) ABSTRACT

This invention relates to structures comprising magnetic materials and conjugated molecules. The invention relates to magneto-resistive devices based on such structures. Structures and devices of the invention can be used as magnetic switches, magnetic sensors and in devices such in/as memory devices.

37 Claims, 5 Drawing Sheets

(51) Int. Cl.
*G11C 11/16* (2006.01)
*H01F 10/32* (2006.01)
*H01L 43/10* (2006.01)
*G11C 11/15* (2006.01)
*H01F 10/00* (2006.01)

(52) U.S. Cl.
CPC .......... *G11C 11/161* (2013.01); *H01F 10/002* (2013.01); *H01F 10/329* (2013.01); *H01L 43/10* (2013.01)

(56) References Cited

U.S. PATENT DOCUMENTS

| | | | | |
|---|---|---|---|---|
| 2003/0001154 | A1* | 1/2003 | Epstein | B82Y 10/00 257/40 |
| 2003/0042562 | A1* | 3/2003 | Giebeler | B82Y 10/002 257/421 |
| 2003/0112564 | A1* | 6/2003 | Granstrom | B82Y 10/00 360/324.12 |
| 2007/0082230 | A1* | 4/2007 | Shi | B82Y 10/00 428/811 |
| 2008/0152952 | A1* | 6/2008 | Santos | B82Y 25/00 428/811.1 |
| 2009/0011284 | A1* | 1/2009 | Wang | B82Y 25/00 428/847.2 |
| 2011/0068290 | A1* | 3/2011 | Haddon | C12Q 1/6881 252/62.51 R |
| 2013/0100724 | A1* | 4/2013 | Venkataraman | G11B 5/02 365/145 |
| 2015/0269955 | A1* | 9/2015 | Yamada | G11B 5/3903 360/244 |
| 2018/0019328 | A1* | 1/2018 | Tal | B82Y 25/00 |

OTHER PUBLICATIONS

Kawahara et al. (Nano Letters, 2012, 12, 4558-4563). (Year: 2012).*
Yoshida et al. (Nano Letters, 2013, 13, 481-485). (Year: 2013).*
Schmaus et al. (cond-mat.mes-hall, Feb. 13, 2011) (Year: 2011).*
Bolotin et al. "Anisotropic magnetoresistance and anisotropic tunneling magnetoresistance due to quantum interference in ferromagnetic metal break junctions" Physical review letters. Sep. 20, 2006;97(12):127202.
International Search Report for PCT Application No. PCT/IL2015/050863 dated Dec. 10, 2015.
Kaneko et al. "Fabrication of a well-defined single benzene molecule junction using Ag electrodes" The Journal of Physical Chemistry Letters. Dec. 6, 2010;1(24):3520-3.
Keane et al. "Magnetoresistance of atomic-scale electromigrated nickel nanocontacts" Applied physics letters. Feb. 6, 2006;88(6):062514.
Kiguchi et al. "Highly conductive molecular junctions based on direct binding of benzene to platinum electrodes" Physical review letters. Jul. 21, 2008;101(4):046801.
Lehwald et al. "Vibration spectroscopy of benzene adsorbed on Pt (111) and Ni (111)" Surface Science. Dec. 2, 1978;78(3):577-90.
Naidyuk YG, Yanson IK. "Point-contact spectroscopy" vol. 145, Springer Science & Business Media; 2005.
Rocha et al. "Towards molecular spintronics" Nature materials. Apr. 1, 2005;4(4):335-9.
Stipe et al. "Single-molecule vibrational spectroscopy and microscopy" Science. Jun. 12, 1998;280(5370):1732-5.

* cited by examiner

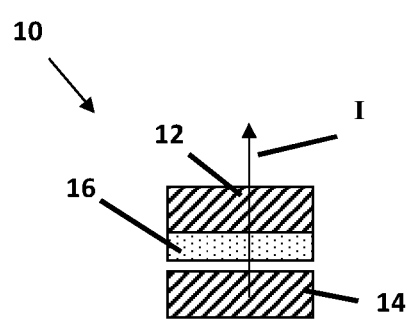
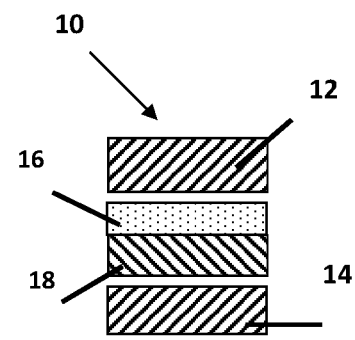
FIG. 1A  FIG. 1B
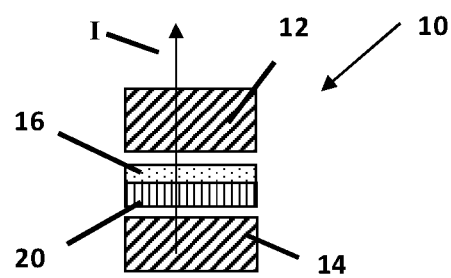
FIG. 1C
Figure 1

FIG. 2A
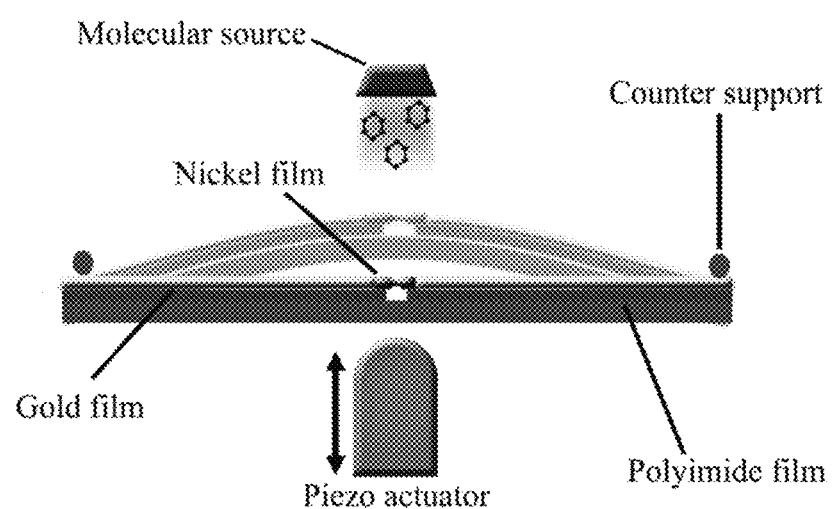
FIG. 2B
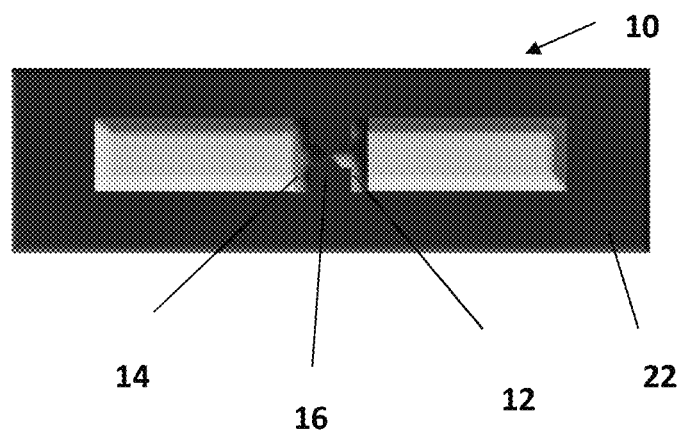
Figure 2

Figure 4

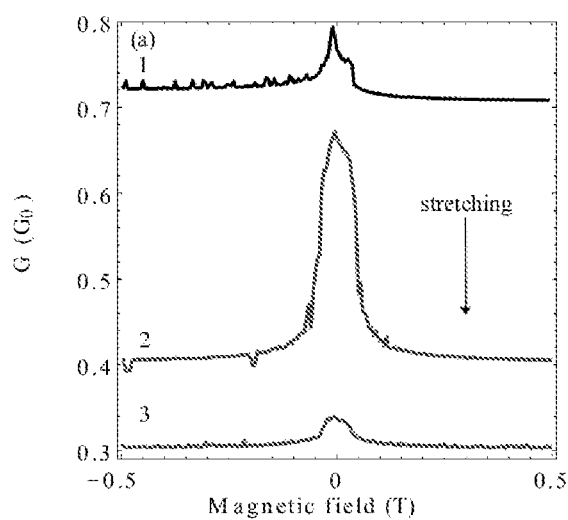
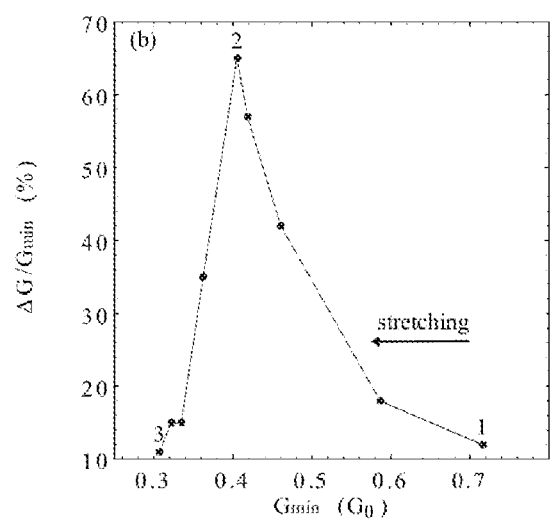
FIG. 5A  FIG. 5B
Figure 5

MAGNETO-RESISTANCE DEVICE INCLUDING CONJUGATED MOLECULE

CROSS-REFERENCE TO RELATED APPLICATIONS

This application is a National Phase Application of PCT International Application No. PCT/IL2015/050863, International Filing Date Aug. 27, 2015, claiming priority of U.S. Provisional Patent Application No. 62/042,875, filed Aug. 28, 2014, which are incorporated in their entirety herein by reference.

FIELD OF THE INVENTION

The present invention is in the field of magneto-resistive devices, and relates to magneto-resistive structures and spintronic devices based on such structures. Structures and devices of the invention can be used as magnetic switches, magnetic sensors and in magnetic devices such as memory devices.

BACKGROUND OF THE INVENTION

Magneto-resistance is the property of a material or a conductive structure to change the value of its electrical resistance in response to an applied external magnetic field. The effects involved include giant magneto-resistance (GMR), tunnel magneto-resistance (TMR) and anisotropic magneto-resistance (AMR). This property is typically used in spintronic devices, such as magnetic sensors and magnetic memory devices.

Early memory storage devices used read heads based on the AMR effect, in which the electrical resistance of a magnetic material depends on whether the magnetization is perpendicular or parallel to the electric current. Subsequent introduction of devices based on the GMR and TMR effects allowed a considerable down scaling of memory elements. The GMR based devices use a combination of at least two different ferromagnetic layers and a normal metal, while TMR based devices have an insulating layer between the ferromagnetic layers. In such structures, the relative parallel or anti-parallel alignment of the magnetization in the ferromagnetic layers leads to a difference in the electrical resistance of the structures.

In spintronic devices, the electric resistance is highly dependent on magnetic field or magnetization. In its basic form, the most common spintronic element is composed of two ferromagnetic electrodes, separated by a non-magnetic metal. When a certain voltage is applied across this structure, a parallel (anti-parallel) alignment of magnetization in the ferromagnetic electrodes results in a high (low) current through the structure due to the GMR effect, creating a spin-valve. Such a spin-valve is based on complicated fabrication techniques to allow a flipping of magnetization direction in one electrode while preserving the magnetization of the other electrode. For GMR based devices, the change in resistance with magnetic field ranges from 5-10% for simple structures to over 100% for complicated multi-layered structures. The sensitivity of GMR devices is orders of magnitude larger than in earlier AMR-based commercial devices, exhibiting magneto-resistive variations below 5%. AMR devices consist of a single ferromagnetic layer, displaying low (high) resistance when the magnetization of the layer is perpendicular (parallel) to the current across the layer. Despite the structural simplicity of AMR devices with respect to GMR devices, the relatively small change in resistance (1%-2% for simple ferromagnetic metals) places a severe limitation on miniaturization of AMR based devices to the characteristic micrometer size of current GMR devices. In such scales, the size of the AMR effect is comparable to the background noise and cannot be used for efficient data storage.

Spintronic devices are also used for high performance magnetic-random access memory (MRAM). For this purpose, the TMR effect is used in ferromagnet-insulator-ferromagnet layered structures, to achieve magneto-resistance of about 30% for tri-layered structures and up to 70% for more complex devices.

In order to further increase the sensitivity of GMR- and TMR-based memory elements, sophisticated production techniques, as well as expansive materials and elaborate multi-layered architectures, are required. In addition, TMR based elements require the use of complicated electronics to amplify the low signal. As for the MRAM elements based on the TMR effect, although making use of such tunnel junctions allows the design of a compact MRAM element, the high resistances of TMR devices result in very low electric signals that require further processing.

Thus, while impressive, the known GMR and TMR devices rely on unique properties of expensive metals and on the fabrication of complex multi-layered structures. The goal of the fabrication processes is two-fold: first, the GMR and TMR effects require some part of the ferromagnetic elements to be magnetically pinned. This allows one to switch from a parallel to anti-parallel magnetization configuration of the electrodes by application of a magnetic field, thereby affecting the scattering or tunneling properties of the charge carriers; second—an increase of the spin polarization of the current is needed, in order to minimize parasitic background current which is insensitive to magnetic manipulation. In addition, for TMR based devices the very small absolute signals require complicated electronic schemes for amplification and noise reduction.

There is a need in the art for a novel magneto-resistive structure, capable of amplifying magneto-resistive effects of electronic devices while retaining a large signal, without the need for rare metals or a complicated device structure.

A novel general approach is needed in order to enhance the sensitivity of spintronic elements, avoid complicated and costly fabrication processes, and maintain a high absolute signal.

SUMMARY OF THE INVENTION

The present invention provides a novel magneto-resistive device configured for amplifying magneto-resistive effects of magnetic elements. The inventors have found a novel approach for amplifying magneto-resistive effects of magnetic elements while maintaining a desirably large signal, and without the need for rare metals or complicated device structure. The technique of the present invention is based on the use of conjugated organic molecules, adsorbed on a surface of a ferromagnetic metal electrode, to enhance magneto-resistive effects in different spintronic devices using such electrodes.

More specifically, the invention takes advantage of the fact that due to the weak spin-orbit and hyperfine interactions in organic molecules, spin-coherence can be preserved over times and distances much longer than in conventional metals or semiconductors. It has been demonstrated theoretically that organic spin valves, obtained by sandwiching single organic molecule between magnetic contacts using unconjugated anchoring groups, show a bias-dependent magneto-resistance, and that the magneto-resistive properties may depend on the choice of the molecule and the anchoring groups. It has been shown theoretically that although the magnitude of the effect varies with the details of the molecule, magneto-resistance can be found both for tunneling and metallic conductance.

The inventors have found that magneto-resistive effects of electronic devices can be significantly amplified, by providing desired coupling between the ferromagnetic surface and conjugated molecules, thus promoting the modification of the surface density of states by π-d hybridization with the conjugated molecules.

The present invention is thus based on the preferential hybridization between specific molecular orbitals in conjugated molecules and spin-polarized frontier orbitals of ferromagnetic metal electrodes.

In one embodiment, this invention provides a magneto-resistive device comprising at least one electrode, said electrode comprising a surface, wherein said surface comprising a ferromagnetic material, wherein said surface is attached to at least one conjugated molecule, such that said molecule is coupled to said surface via π-d hybridization between π molecular orbitals and d orbitals of the ferromagnetic material.

In one embodiment, the electrode of said magneto-resistive device comprises Ni, and the conjugated molecule is an acene or an oligoacene molecule. In one embodiment, the conjugated molecule comprises benzene.

In one embodiment, the magneto-resistive device further comprises a second electrode the second electrode comprises a surface, the surface at least partially facing the first electrode. In one embodiment, one end of the conjugated molecule is attached to the surface of the first electrode and another end of the conjugated molecule is attached to a surface of the second electrode.

In one embodiment, the surface of the second electrode comprises a ferromagnetic material, wherein the attachment of the conjugated molecule to the surface comprises coupling of the conjugated molecule to the surface via π-d hybridization between π molecular orbitals of the conjugated molecule and d orbitals of the ferromagnetic material.

In one embodiment, the conjugated molecule act as a transport medium between the electrodes, thereby increasing selectivity of spin transport between the electrodes, thus amplifying magnetic effects in the device.

In one embodiment, the magneto-resistive device is configured and operable as an anisotropic magneto-resistance (AMR) device characterized by anisotropic magneto-resistance.

In one embodiment, the surfaces of the first and second electrodes comprise a ferromagnetic material and the device further comprises a non-magnetic metal located between the surfaces, wherein at least one of the surfaces is chemically modified by the conjugated molecule, such that the device is a giant magneto-resistive (GMR) device.

In one embodiment, the surfaces of the first and second electrodes comprise a ferromagnetic material and the device further comprises a dielectric material located between the surfaces, wherein at least one of the surfaces is chemically modified by the conjugated molecule, such that the device is a tunneling magneto-resistive (TMR) device.

In one embodiment, this invention provides a magnetic memory device, comprising an array of junctions, each formed by a layer of conjugate molecules bridging ferromagnetic surfaces of two electrodes, wherein the conjugated molecule is coupled to the ferromagnetic surface of at least one of the electrodes via π-d hybridization of π molecular orbitals and d orbitals of the ferromagnetic material of the electrode.

In one embodiment, this invention provides a magneto-resistive device comprising at least one electrode, said electrode comprising a surface, wherein said surface comprising a ferromagnetic material, wherein the surface is attached to at least one conjugated molecule, such that said molecule is coupled to said surface via π-d hybridization between π molecular orbitals and d orbitals of the ferromagnetic material.

In one embodiment, this invention provides a magneto-resistive device configured and operable as an anisotropic magneto-resistance (AMR) device characterized by anisotropic magneto-resistance.

In one embodiment, this invention provides a magnetic memory device, comprising an array of junctions, each formed by a layer of conjugated molecules bridging ferromagnetic surfaces of two electrodes, wherein said conjugated molecule is coupled to the ferromagnetic surface of at least one of the electrodes via π-d hybridization of π molecular orbitals and d orbitals of the ferromagnetic material of said electrode.

In one embodiment, this invention provides a layered magneto-resistive device comprising:
  a first magnetic material layer;
  a molecular layer comprising a first surface and a second surface; and
  a second magnetic material layer;
wherein said first surface of said molecular layer is in contact with said first magnetic material layer and wherein the second surface of the molecular layer is in contact with the second magnetic material layer, such that:
  molecules of said first surface are coupled to said first magnetic material layer via π-d hybridization between π molecular orbitals and d orbitals of said magnetic material; and
  molecules of said second surface are coupled to said second magnetic material layer via π-d hybridization between π molecular orbitals and d orbitals of said second magnetic material.

In one embodiment, this invention provides a layered magneto-resistive device comprising:
  a first magnetic material layer;
  a non-magnetic metal layer;
  a molecular layer comprising a first surface and a second surface; and
  a second magnetic material layer;
wherein said first surface of said molecular layer is in contact with said non-magnetic metal layer and wherein said second surface of said molecular layer is in contact with said second magnetic material layer, such that:
  molecules of said first surface are coupled to said non-magnetic metal layer; and
  molecules of said second surface are coupled to said second magnetic material layer via π-d hybridization between π molecular orbitals and d orbitals of said magnetic material.

In one embodiment, this invention provides a layered magneto-resistive device comprising:
  a first magnetic material layer;
  a dielectric layer;
  a molecular layer comprising a first surface and a second surface; and
  a second magnetic material layer;
wherein said first surface of said molecular layer is in contact with said dielectric layer and wherein said second surface of said molecular layer is in contact with said second magnetic material layer, such that:

molecules of said first surface are coupled to said dielectric; and molecules of said second surface are coupled to said second magnetic material layer via π-d hybridization between π molecular orbitals and d orbitals of said magnetic material.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 1A schematically illustrates a basic structure of the magneto-resistance element of the present invention suitable to form an AMR-based device;

FIGS. 1B and 1C schematically illustrate GMR- and TMR-effect based devices utilizing the structure of FIG. 1A;

FIGS. 2A and 2B schematically illustrate side and top views respectively of an exemplary mechanically controllable break junction device of the invention;

FIG. 3C corresponds to a molecular junction after admission of molecules, $G_{min}=0.42\ G_0$.

FIGS. 5A and 5B show a change of amplification with molecular configuration, where FIG. 5A shows magneto-conductance measurements taken on a specific molecular junction, and FIG. 5B shows relative magneto-conductance obtained from the same stretching series shown in FIG. 5A, the numbers mark the relevant curves shown in FIG. 5A.

Figure 3:
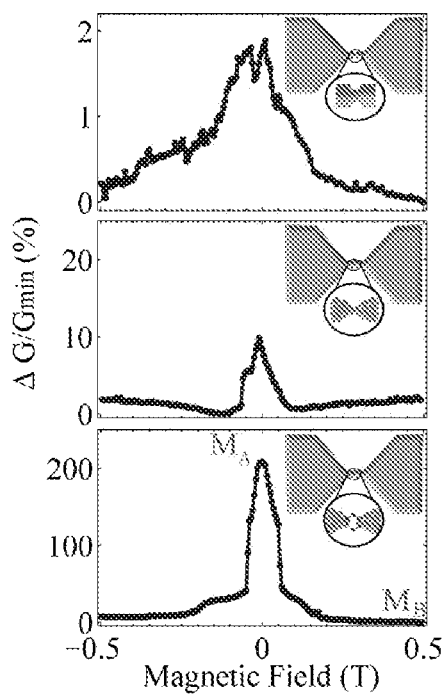
FIGS. 3A to 3C illustrate relative conductance of the magneto-resistive structure (device) as a function of the magnetic field applied along the axis of the junction. The magnetic field is swept along the junction axis. It was found (not shown here) that the spontaneous magnetization of the samples shown (at zero magnetic field) is aligned perpendicular to the junction axis and in its plane. Accordingly, sweeping the magnetic field along the junction axis is equivalent to rotating the magnetization in 180 degrees as in FIG. 3E below. Measurements were taken at different stages of contact stretching, where FIG. 3A corresponds to a point contact, $G_{min}=43.26\ G_0$ ($G_0=1/12906\ \Omega^{-1}$; $G_{min}$ is the minimal conductance achieved when the magnetization is aligned with the current direction either parallel or antiparallel. In the specific case here $G_{min}$ is the minimal conductance achieved when the magnetic field reaches 0.5 Tesla), FIG. 3B corresponds to an atomic junction, $G_{min}=1.36\ G_0$.
FIG. 3D is a schematic description of magnetization under an applied field in angle θ with respect to the current direction.
FIG. 3E shows the magneto-conductance measurement as a function of a magnetic field angle at constant amplitude of 0.3 Tesla; relative magneto-conductance being defined as $\Delta G/G_{min}=(G-G_{min})/G_{min}$.
Figure 3:
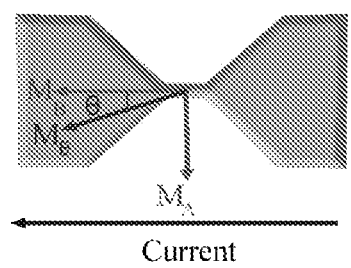
Figure 3:
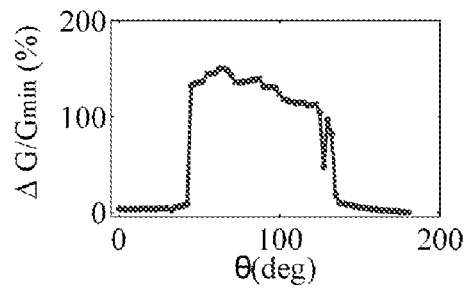

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

In one embodiment, the present invention provides a novel magneto-resistive device, which is particularly useful in magnetic sensors or magnetic memory devices. The magneto-resistive device of the invention utilizes conjugated molecules, such as π—conjugated benzene molecules, as a transport medium between two ferromagnetic electrodes. This results in significant amplification of magneto-resistance effects.

In one embodiment, in order to demonstrate the effect, the inventors used a conjugated molecule, such as benzene, bridging two nickel electrodes in a mechanically controlled break-junction setup (see FIGS. 2A and 2B). This resulted in an order-of-magnitude amplification of magneto-resistive effects, as compared to the bare nickel atomic junction. The inventors have shown that by using conjugated molecules as the transport medium in the junction it is possible to fabricate simple, highly sensitive and fully controlled devices relying on the seemingly obsolete AMR effect. The same scheme can also dramatically improve the performance of current GMR and TMR based memory and sensor devices by adding a layer of conjugated molecules in between the different magnetic layers. In one embodiment, the molecular layer serves as a transport medium in the case of TMR and as a spin-selective scattering layer in the case of GMR.

More specifically and in one embodiment, the inventors used the special bonding properties of conjugated acene/oligoacene molecules to ferromagnetic surfaces. The adsorption process involves hybridization between the delocalized, π orbitals of the molecule (π molecular orbital is formed by the carbon atomic $p_z$ orbitals) and the highly-spin polarized d orbitals of the metal electrodes. This π-d hybridization results in preferential conductance through the spin-polarized orbitals, promoting spin injection from the ferromagnetic electrodes, and leads to suppression of unwanted unpolarized current components, which are mostly injected by the frontier s orbitals of the metal. As a result of this selective hybridization, magneto-resistive effects are amplified by at least one order of magnitude. The molecules connect to the ferromagnetic surface of the electrode by π-d bonds, thus chemically modifying the surface to increase the selectivity of spin transport.

In one embodiment, the ferromagnetic surface of the electrode is prepared/treated to be reactive in the sense that it promotes adsorption (physisorption/chemisorption) of the target molecules (the conjugated molecules) directly on the surface, via π-d hybridization (but not necessarily exclusively). Passivation of the ferromagnetic surface by surface contaminations can suppress the adsorption of molecules by the π-d hybridization. In addition, the use of chemical side-groups (e.g. anchoring groups) that are attached to the molecule and chemically bind to the electrode surface may suppress the required π-d hybridization. Generally, clean, unpassivated electrode surfaces can be achieved by deposition of metal films and molecular films under ultra-high vacuum conditions or in a clean solution.

The inventors have used clean, non-flat (rough/corrugated) electrode surfaces, due to the higher reactivity in comparison to a flat surface. More specifically, and in one embodiment, metallic tips were exposed by pulling apart and breaking a metal thin wire (constriction) to form new surfaces in cryogenic vacuum conditions. The corrugated surface was formed during the rupture of the metal constriction.

In one embodiment, corrugated is a rough, non-flat surface that contains under-coordinated or low-coordinated atoms.

The principles of the invention provide high magneto-resistance in a simple structure, and it is ideal for sensitive yet elementary memory devices. In particular, the inventors have shown that the incorporation of a benzene molecule in a simple AMR device structure provides enhanced magneto-resistive sensitivity as well as high absolute signal. Furthermore, this scheme is practical down to sub-nanometer scale. The inventors have experimentally demonstrated that the use of Ni\benzene interface in such a structure enhances considerably the AMR to about 200% (see FIGS. 3C and 3E).

The present invention allows production of much cheaper and simpler magneto-resistive devices, exhibiting equal or better performance than devices produced by current technology. The inventors have demonstrated this for the first time using the smallest possible magneto-resistive element, consisting of two atomic-scale tips with a single benzene molecule in-between. The same principle of chemical modification of ferromagnetic surfaces by conjugated organic molecules enables the fabrication of inexpensive and highly efficient memory elements by adding a molecular monolayer or more, consisting of conjugated organic molecules in between two ferromagnetic electrodes. This scheme can also be used to further enhance the performance of present day ferromagnetic memory elements and magnetic field sensors based on GMR or TMR by simply adding a layer of conjugated molecules between the ferromagnetic and normal metal films (in GMR based devices) or between the ferromagnetic and dielectric films (e.g., in TMR based devices) in order to modify the spin-related electronic properties of interfaces.

The magneto-resistive devices of the present invention could be used in magnetic random access memory devices. The present day realization of such devices consists of a two-dimensional array of tunnel junctions in which a specific bit is accessed by transmitting current between two ports of the array. This realization is complicated due to the low absolute signals associated with tunnel junctions. Using the present invention and in one embodiment, the tunnel junctions are replaced by the specified molecular junctions. The resulting device includes an array of highly sensitive and compact memory bits with a high absolute signal, while not changing the basic method of accessing an individual bit. Alternatively, the invention can be used to improve existing TMR based devices, by adding a layer of conjugated molecules between the ferromagnetic and insulating layers, thus increasing the efficiency of spin injection Finally, one can use a thicker layer of conjugated molecules to act as a tunneling barrier while gaining superior spin injection capabilities thanks to interface modifications by the first layer(s) of molecules, while the rest of the molecules act as a tunneling medium.

Thus, according to one broad aspect of the invention, there is provided a magneto-resistive device comprising a pair of electrodes arranged in a spaced-part relationship, a ferromagnetic surface of at least one of the electrodes, by which it faces the other electrode, being chemically modified by conjugated molecules coupled to the ferromagnetic surface via π-d hybridization of π molecular orbitals and d orbitals of the ferromagnetic material.

The electrodes, and accordingly, the ferromagnetic surfaces, may be of any suitable geometry/shape, e.g., the surfaces may be substantially planar or not, and the electrodes may have polygonal or substantially circular cross-section. For example, the magneto-resistive device may be configured as a multi-layer (stacked) structure, or may be configured as two crossing wires of a ferromagnet with the molecules in between.

In some embodiments, the ferromagnetic surface, chemically modified by the conjugated molecules, is unpassivated, and preferably also corrugated, thereby promoting said π-d hybridization.

The ferromagnetic electrodes may be Ni electrodes, and the conjugated molecules may be π-conjugated molecules, such as benzene molecules.

The conjugated molecules, coupled to the ferromagnetic surface of at least one of the electrodes, act as a transport medium between the ferromagnetic surfaces of the electrodes, thereby increasing selectivity of spin transport between the electrodes and amplifying magnetic effects in the device. It should be understood, that both electrodes may have their ferromagnetic surfaces by which they face one another, chemically modified by the conjugated molecules coupled to the ferromagnetic surface via π-d hybridization between π molecular orbitals and d orbitals of the ferromagnetic material.

In some embodiments, a transport medium (a non-ferromagnetic medium) is attached to the molecular-modified ferromagnetic layer or layers such that the transporting electrons are scattered in a spin-selective manner from the modified ferromagnetic layer or layers.

Considering the AMR configuration of such a device, the use of conjugated molecules as a transport medium between the ferromagnetic surfaces of the electrodes, enhances anisotropic magneto-resistance of the device.

Considering a GMR configuration of such a device, the use of conjugated molecules at the interface with the conducting medium can enhance spin-selective scattering, leading to enhancement of the measured GMR of the device.

An array of the above structures can be used in a multi-bit magnetic memory device, where each of the magneto-resistive structures comprise a junction formed by the conjugate molecule bridging ferromagnetic surfaces of two electrodes, wherein the conjugate molecule is coupled to the ferromagnetic surface of at least one of the electrodes as described above.

This is specifically demonstrated for the case of the long-neglected AMR effect in a symmetric junction. While a bulk nickel junction exhibits a conductance change of below 2%, the conductance of the nickel-benzene-nickel molecular junction changes by about 200% with application of an external magnetic field. This change depends on the angle between the current through the junction and the magnetic field (or the electrode magnetization). In addition, the amplification can be optimized by changing the inter-electrode distance. FIGS. 5A and 5B demonstrate a sequence of AMR measurements taken for different inter-electrode distance in steps of 0.1 Å. The maximal AMR is achieved for a certain inter electrode distance, implying a preferred metal-molecule-metal configuration that yields high AMR. These finding can have a profound effect on the design of present and future magnetic memory elements and sensors.

Reference is now made to FIGS. 1A-1C schematically illustrating examples of a magneto-resistive structure, generally designated as 10, configured according to some embodiments of the present invention. To facilitate understanding, the same reference numbers are used for identifying the structural/functional components that are common in all the examples/embodiments of the invention.

FIGS. 1A to 1C illustrate some magneto-resistive devices of the invention, used in spintronic devices based on, respectively, the AMR, GMR and TMR effects. As shown in FIG. 1A, the basic magneto-resistive element/structure/device 10 of the invention includes an electrode 12 of a ferromagnetic material, or generally an electrode having a ferromagnetic surface, where the ferromagnetic surface of the electrode is chemically modified by conjugated molecules 16 directly adsorbed/coupled to the ferromagnetic surface 12, via π-d hybridization of π molecular orbitals and d orbitals of the ferromagnetic material. Such π-d bonding at the electrode-molecular interface provides high electrode-molecule coupling, which corresponds to a conductance of around 1-0.1 $G_0$ per molecule. High signal means easier, more reliable and cheaper signal detection, the latter is due to a simpler detection circuit. In the high coupling regime, the interaction between the molecules and the ferromagnetic surface results in relatively wide peaks in the density of states profile. In the experiments conducted by the inventors and described herein below, high electrode-molecule coupling, characterized by conductance equal to or higher than 0.3 $G_0$, has been achieved.

The structure 10 of FIG. 1A may form an AMR device, formed by pair of electrodes arranged in a spaced-apart relationship such that their ferromagnetic surfaces face one another, where the conjugated molecule(s) is/are directly adsorbed/coupled to at least one of these surfaces and act(s) as the transport medium in the junction between the electrodes (the electric current is transmitted perpendicularly in a direction I to the molecular layer from electrode 14 to electrode 12, or vice versa), resulting in a significant amplification of the magneto-resistive effect. This enables to fabricate simple, highly sensitive and fully controlled spintronic device relying on the seemingly obsolete AMR effect.

It should be noted that the basic magneto-resistive element/structure 10 of the invention, as well as AMR, GMR and TMR device utilizing such basic structure, may have any suitable geometry/configuration, provided it has at least one electrode having a ferromagnetic surface chemically modified by conjugated molecule(s) 16 directly adsorbed/coupled to the ferromagnetic surface 12, via π-d hybridization of π molecular orbitals and d orbitals of the ferromagnetic material. This may be a multi-layer (stacked) configuration, or for example a configuration of two crossing wires of a ferromagnet with the molecules in between. In other words, the ferromagnetic surfaces of the electrodes to which the molecules are adsorbed may be substantially (macroscopically) planar or not, i.e. the electrodes may have a polygonal or substantially circular cross section.

In the example of FIG. 1B, the GMR device is formed by ferromagnetic electrodes 12 and 14 with a non-magnetic metal layer 18 between them, and conjugated molecules 16 adsorbed by π-d hybridization to the ferromagnetic surface of one electrode 12, or both electrodes 12 and 14 (not shown in the figure). FIG. 1C exemplifies the TMR device including ferromagnetic electrodes 12 and 14 with a dielectric layer 20 between them, and conjugate molecules 16 adsorbed by π-d hybridization to the ferromagnetic surface of electrode 12, or both electrodes 12 and 14 (not shown in the figure). In these configurations, the performance of GMR and TMR based device (such as memory or sensor elements) is significantly improved due to the use of the conjugated molecules in between the different magnetic layers, as a spin-selective scattering medium in the case of GMR, and a transport medium in the case of TMR.

As described above, the ferromagnetic surface of the electrode carrying the conjugated molecules is prepared/treated to be unpassivated (i.e not covered by adsorbates/contaminations) other than the conjugated molecule. This is done in order to promote modification by π-d hybridization with the conjugate molecules. Also, as indicated above, this surface is preferably corrugated/rough, rather than microscopically flat.

Reference is made to FIGS. 2A and 2B showing an example of mechanically controllable break junction device of the invention. In this example, the break-junction technique is used to create junctions formed by a single conjugate molecule 16, suspended between two ferromagnetic metal electrodes 12 and 14. The inventors conducted experiments that demonstrate the amplification of magneto-resistance using the smallest possible memory element, based on individual benzene molecules as a spacer between two nickel atomic electrodes. The realization of such a device is based on a common ferromagnetic metal and does not involve elaborated multi-layered structures. To demonstrate the efficiency, the experiments were focused on the relatively small AMR effect. The nickel-benzene structures configured according to the invention exhibit magneto-resistance of up to 200% (i.e. ~200% change in conductance as presented in FIG. 3C (208%)). This response is two orders of magnitude larger than the magneto-resistance of bulk nickel, which is 1-2%.

The magneto-resistive properties described above show that the present invention allows production of much cheaper and simpler devices exhibiting equal or better performance than devices produced by current technology. In the simplest experiments, this was demonstrated for the smallest possible magneto-resistive element, formed by two atomic scale tips with a single molecule in-between. In a similar manner, inexpensive and highly efficient memory elements can be produced by adding molecular films/layers, composed of conjugated organic molecules, in between two ferromagnetic electrodes (FIG. 1A), as well as in ferromagnetic memory elements and magnetic field sensors based on GMR by simply adding a layer of conjugated molecules between the ferromagnetic and normal metal films (FIG. 1B). The present day realization of a magnetic random access memory (MRAM) device uses the TMR-based configuration. MRAM device includes a two dimensional array of tunnel junctions in which a specific bit is accessed by transmitting current between two ports of the two-dimensional array. This realization is complicated due to the low absolute signals associated with tunnel junctions. Using the present invention, the tunnel junctions are replaced by molecular junctions. This results in an array of highly sensitive and compact memory bits with a high absolute signal, while not changing the basic method of accessing an individual bit. Alternatively, the invention can be used to improve existing TMR based devices, by adding a layer of conjugated molecules between the ferromagnetic and insulating layers (FIG. 1C), thus increasing the efficiency of spin injection. Also, a thick layer of conjugated molecules can be used to act as the tunneling barrier while gaining superior spin injection capabilities due to the molecule-induced chemical modifications of the interfaces. According to this aspect and in one embodiment, the molecular layer replaces the conventional dielectric material used in such TMR junctions.

Thus, using conjugated molecules, such as the π—conjugated benzene molecules, as a transport medium or spin-selective scattering medium between two ferromagnetic electrodes results in significant amplification of magneto-resistance, i.e., by at least an order of magnitude. The inventors have experimentally demonstrated this for the case of the long neglected AMR effect in a symmetric junction. While the bulk nickel junction exhibited a conductance change of below 2%, the conductance of nickel-benzene-nickel molecular junction was changed by about 200% with application of an external magnetic field. This change may be dependent on the angle between the current through the junction and the magnetic field. In addition, the amplification can be optimized by changing the inter-electrode distance.

Materials

In one embodiment, devices of this invention comprise two electrodes comprising magnetic material, connected through at least one conjugated molecule. According to this aspect and in one embodiment, such device functions as AMR device. In such AMR device, the molecule preserves the high conductance and the measurement is AMR measurement. The magnitude of the AMR effect is up to 208% in some embodiments for devices of this invention.

In one embodiment, devices of this invention comprise two electrodes comprising magnetic material, connected through at least one conjugated molecule and at least one non-magnetic metal. According to this aspect and in one embodiment, such device functions as GMR device.

In one embodiment, devices of this invention comprise two electrodes comprising magnetic material, connected through at least one conjugated molecule and at least one dielectric material. According to this aspect and in one embodiment, such device functions as TMR device. In some embodiments, the dielectric comprises or consists of the conjugated molecules. In other embodiments, the dielectric comprises or consists of material(s) other than the conjugated molecules.

In the AMR, GMR and TMR devices described herein above, the electrodes comprise a magnetic material. In one embodiment, the magnetic material is ferromagnetic. In one embodiment the magnetic material is antiferromagnetic. In one embodiment the magnetic material comprises Ni. In one embodiment, the magnetic material comprises Fe, Ni, Co, oxides thereof, alloys thereof and combinations thereof.

In the AMR, GMR and TMR devices described herein above, the devices comprise a conjugated molecule. In one embodiment, the conjugated molecules comprise any molecule comprising alternating double and single bonds. In one embodiment, the conjugated molecules comprise acene molecules. In one embodiment, the conjugated molecules comprise oligoacene molecules, polyacene molecules, molecules comprising or consisting of fused rings, polynuclear aromatic molecules and derivatives thereof. In one embodiment, any molecule for which the molecular orbitals will selectively bind to the d orbitals of the metal and not to the metal s orbitals, can be used as the conjugated molecule used in embodiments of the invention. Such molecules will promote spin-polarized current injection from the spin polarized d orbitals and will suppress unwanted spin degenerate (non-spin polarized) current injection from the poorly spin-polarized metal s orbitals. For example, molecules with molecular orbitals that have a prominent p atomic orbital character might yield similar magnetoresistance enhancements. In one embodiment, the conjugated molecules comprise conjugated oligomers or conjugated polymers. In one embodiment, the conjugated molecules comprise fused aromatic rings. In one embodiment, the conjugated molecules are phenylenes, oligophenylenes, polyphenylenes or combinations thereof. In one embodiment, the conjugated polymers comprise polyacetylene and any derivative thereof. In one embodiment, the conjugated molecule is polythiophene.

In one embodiment, the molecules consist of fully-conjugated organic molecules. According to this aspect and in one embodiment, the molecules do not possess non-conjugated side groups (end groups). According to this aspect and in one embodiment, the molecules are not bound to the magnetic metal through a non-conjugated portion of the molecule. In one embodiment, the fully-conjugated molecule does not comprise non-conjugated anchoring groups. The fully-conjugated molecule is coupled to the surface of the magnetic metal through π-d hybridization between π molecular orbitals and d orbitals of the ferromagnetic material. In one embodiment, the molecules do not comprise thiol (S—H) end groups. In other embodiments, the molecule does comprise thiol end groups.

In one embodiment, the organic conjugated molecule is any molecule that can be coupled to the magnetic material and can provide large magneto-conductance.

In one embodiment, devices of this invention are stable over long periods of time. According to this aspect and in one embodiment, devices of this invention do not include temporary structures such as structures defined by a surface, a molecule and an STM tip.

In one embodiment, the conjugated molecule comprises graphene, graphite, carbon nanotubes, fullerenes and molecular derivatives thereof. In another embodiment, the conjugated molecule does not comprise graphene, graphite, carbon nanotubes, fullerenes and molecular derivatives thereof.

In one embodiment, the conjugated molecules are biological molecules. In one embodiment, the organic molecules do not comprise metal-ions. In another embodiment, the organic molecules comprise metal ions.

In one embodiment, in AMR devices of this invention, the AMR device comprises only one ferromagnetic electrode and one non-magnetic electrode made, for example, from gold. Any other non-magnetic electrode may work as well.

In one embodiment, in GMR devices of this invention, the non-magnetic metal comprises Cu, Ta, Ru, Ag, Ti, Cr. In one embodiment the non-magnetic metal comprises alloys comprising Cu, Ta, Ru, Ag, Ti, Cr. In one embodiment the non-magnetic metal comprises alloys comprising Cu, Ta, Ru, Ag, Ti, Cr or combinations thereof. Any other non-magnetic metal/metal alloy may be used as well.

In one embodiment, in TMR devices of this invention, the dielectric material comprises metal-oxides, silicon oxide, polymers, insulating molecules (e.g. alkanes) or combinations thereof.

In one embodiment, the magnetic material or portions thereof is amorphous. In one embodiment, the magnetic material is crystalline or polycrystalline. In one embodiment, the magnetic material or portions thereof is in the form of nanoparticles, nanotubes, nanofibers, nanorods or a combination thereof.

Shape and Geometry

In one embodiment, in devices of the invention, a conjugated molecule (or a collection of conjugated molecules) spans the distance between the surfaces of two magnetic materials. In one embodiment, at least one magnetic material (electrode) is tapered/pointed or comprises a tapered/pointed tip. In one embodiment, the thinnest edge of the tapered/pointed material is the area where the conjugated molecule is attached. In one embodiment, the tapered/pointed shape of the magnetic material is of a regular or an irregular form. In one embodiment, the tapered/pointed area is symmetric, asymmetric or of any symmetry degree.

Layered structure: in one embodiment, the electrodes and the conjugated molecules (and optionally the non-magnetic material or dielectric material) are arranged in a layered structure as shown (side view in FIGS. 1A-1C). According to this aspect and in one embodiment, the conjugated-molecule layer is a film, coating the electrode(s). The thickness of the molecular film can be determined by the amount of molecules used.

Molecules: in one embodiment, only one molecule is bounded between the two electrodes. In another embodiment, two or more molecules are bounded between the two electrodes. In one embodiment, 1-10 molecules are bonded between the electrodes. In one embodiment, more than 10 molecules are bounded between the electrodes. In one embodiment, the molecules are arranged side by side and at least a portion of the molecules is attached at one end to a first electrode, and on the other end to the second electrode. In one embodiment, the molecules are arranged as a string one on top of the other, such that the first molecule is attached to the first electrode and the last molecule on the string is attached to the second electrode. The molecules between the first and the last molecules are attached to one another in a row. In one embodiment, each molecule is viewed as a building block and the molecules are arranged as building blocks at any possible structure such that at least one molecule is attached to the first electrode and at least one molecule is attached to the second electrode. In one embodiment, 1-100, 1-1000, 1-10,000, 1-100,000, 1-1,000,000 molecules are located between the two electrodes. In one embodiment, the density of the molecules on the surface of the electrode is ranging between $1\times10^{13}$ and $1\times10^{15}$ molecules per $cm^2$. In one embodiment, the density of the molecules on the surface of the electrode is up to $1\times10^{15}$ molecules per $cm^2$. In one embodiment, a monolayer of molecules is bonded between the two electrodes. In one embodiment, a bilayer of molecules is bonded between the two electrodes. In one embodiment, a multilayer of molecules is bonded between the two electrodes. In one embodiment, a film of molecules is present between the electrodes. In one embodiment, a 2-D film of molecules is a monolayer of molecules, arranged side-by side, i.e. an array of molecules, each attached to the surface of the electrode(s). In one embodiment, a 3D arrangement of molecules is utilized. A 3-D arrangement comprises a multilayer of molecules such that each monolayer within the multilayer is considered a 2-D structure.

The description herein above related to the number of molecules and geometry/arrangement of molecules between two electrodes is also applicable to molecules residing between an electrode and a dielectric or to molecules residing between an electrode and a non-magnetic metal in TMR and GMR devices/structures of this invention.

In one embodiment, the molecules are physisorbed onto the magnetic material. In one embodiment, the molecules are chemisorbed onto the magnetic material. In one embodiment, chemisorption describes a bond with bond strength similar to the strength of a covalent bond. In one embodiment, chemisorption describes a bond with a bond strength ranging between and including the strength of hydrogen bond to the strength of a covalent bond. In one embodiment, physisorption describes a bond with bond strength ranging between and including the strength of van der Waals forces or London forces to the strength of a hydrogen bond or to the strength of a covalent bond. Any other bond strength between molecules and electrodes of this invention is possible in some embodiments.

In one embodiment, the molecules are arranged in an "amorphous", non-layered structure. In one embodiment, the molecules are arranged/packed in a crystalline, semi-crystalline, or polycrystalline structure. In one embodiment, domains/areas of the molecules are of one crystallinity and others are amorphous or possess other crystal structure. In one embodiment, only a portion of the surface of the electrode is covered by the molecules. In one embodiment, the layer or film of molecules is uniform. In another embodiment, the layer/film of molecules is non-uniform. In one embodiment, holes exist in the molecular layer/film.

Devices of this invention and methods of production thereof allow control over the magnetic response of the device. Devices of this invention and methods of production thereof allow high yield in device production. Devices of this invention and methods of production thereof allow temperature and bias controlled magneto-conductance, large conductance signals and high magneto-conductance ratios. Devices of this invention offer controlled binding between the organic molecules and the magnetic electrodes. Devices of this invention and methods of production thereof allow controlled contact geometry. The choice of the organic conjugated molecule in devices of this invention in terms of molecular end groups and the nature of the molecule, contribute to the high performance of magneto-resistance devices of this invention in some embodiments. The ability to achieve the appropriate bond/coupling between the organic conjugated molecule and the magnetic materials is one key feature in the construction of efficient magnetoresistance devices of this invention. Another novel feature of devices of this invention is the purity of the system components. During assembly of the molecule(s), both the molecule and the magnetic metal are in a highly pure form. Both the surface of the magnetic metal and the molecule(s) are clean and practically lack impurities and contaminations. Such purity enables the formation of the desired $\pi$-d hybridization between $\pi$ molecular orbitals and d orbitals of the ferromagnetic material. Such pure conditions are achieved using pure starting materials, using high vacuum or ultra-high vacuum conditions during processing and by surface cleaning methods in some embodiments.

In some embodiments the existence of metal atoms protruding from the metal surface enables the formation of the desired $\pi$-d hybridization between $\pi$ molecular orbitals and d orbitals of the ferromagnetic material.

In some embodiments, coupling/bonding between the organic molecules and other non-magnetic/dielectric materials in devices of the invention is enabled according to some of the embodiments disclosed herein above for molecule-magnetic materials bonding.

Dimensions and Values

In one embodiment, the thickness of the magnetic material (electrodes) ranges between 0.1 nm to 1 centimeter.

In one embodiment, the spacing between the electrodes is ranging between 0.1 nm (1 Å) and 10 microns.

In one embodiment, devices of this invention are operated at any temperature. In one embodiment, devices of this invention are operated at room temperature. In one embodiment, devices of this invention are operated at 0° C.±10° C. In one embodiment, devices of this invention are operated at −78° C.±10° C. In one embodiment, devices of this invention are operated at −195° C.±10° C. In one embodiment, devices of this invention are operated at about 4° K. In one embodiment, devices of this invention are operated at a temperature range of −50° C. and +50° C.

In one embodiment, the strength of the magnetic field applied to devices of this invention during operation ranges between 0.01 Tesla to 10 Tesla.

In one embodiment, the angle of the magnetic field applied to devices of this invention during operation ranges between [0° and 360°] with regards to the direction defined by a line crossing the two magnetic materials and the conjugated molecule (see for example the arrow in FIGS. 1A and 1C corresponding to e.g. 0°). In one embodiment, angles of the magnetic field can be any angle(s) needed in order to obtain the AMR effect in devices of this invention. For example an angle of 100° and an angle of 0° can be used as an "ON" and "Off" states in devices of this invention.

In one embodiment, in devices of the invention the conductance is varied in response to changes in the magnetic field. In one embodiment, the AMR, TMR and GMR effects are described by a conductance ratio (magneto-conductance). In one embodiment, the conductance ratio is the ratio between conductance under certain magnetic field magnitude/orientation and between conductance under different magnetic field magnitude/orientation. In one embodiment, such conductance ratio is defined by %. In one embodiment, the conductance ratio or magneto-conductance is described by $\Delta G/G_{min}$ (%), as shown for example in FIGS. 3A-3C.

In one embodiment, the % magneto-conductance for devices of this invention ranges between 1% and 200%. In one embodiment, the % magneto-conductance for devices of this invention ranges between 100% and 300% or between 10% and 500%. In one embodiment, the % magneto-conductance for devices of this invention ranges between 10% and 100% or between 30% and 500%, or between 200% and 1000%, or between 100% and 10,000%, or between 30% and 500%. In one embodiment, the % magneto-conductance for devices of this invention is higher than 50%. In one embodiment, the % magneto-conductance for devices of this invention is higher than 100%. In one embodiment, the % magneto-conductance for TMR and GMR devices of this invention ranges between 50% and 1000%. In one embodiment, the % magneto-conductance for TMR and GMR devices of this invention ranges between 1000% and 10,000%.

In one embodiment, the conductance signal in devices of the invention is high enough to be detected using simple means. In one embodiment, the conductance signal is at the range of 0.1 $G_0$. In one embodiment, the range of the conductance signal is higher than $10^{-5}$ $G_0$. In one embodiment, the range of the conductance signal is higher than $10^{-4}$ $G_0$. In one embodiment, the range of the conductance signal is higher than $10^{-3}$ $G_0$. In one embodiment, the range of the conductance signal is higher than $10^{-2}$ $G_0$. In one embodiment, the range of the conductance signal is higher than $10^{-1}$ $G_0$. In one embodiment, the range of the conductance signal is higher than $G_0$. In one embodiment, the range of the conductance signal is higher than 10 $G_0$. In one embodiment, the conductance signal is much larger than $G_0$. In one embodiment, the range of the conductance signal includes the range of the conductance signal both at the "ON" and at the "OFF" states. In one embodiment, the range of the conductance signal includes the range of the conductance signal at the "ON" state.

Devices

In one embodiment, devices of the invention comprise two magnetic materials and conjugated molecules located between the two magnetic materials. In one embodiment, devices of this invention further comprise electrical contacts, power supply, magnetic field generator, magnet, coil, electronics, current meter, temperature controllers/cooling means, sensors, processors, other electrical components, computer, mechanical and electrical stabilizing components, display, converters, amplifiers, noise-reduction elements, signaling elements, light/voice components and any other component related to magneto-resistance devices as known to a person of ordinary skill in the art.

In one embodiment, this invention provides a magneto-resistive device comprising at least one electrode, said electrode comprising a surface, wherein said surface comprising a ferromagnetic material, wherein said surface is attached to at least one conjugated molecule, such that said molecule is coupled to said surface via π-d hybridization between π molecular orbitals and d orbitals of the ferromagnetic material.

In one embodiment, the surface is unpassivated, thereby promoting said π-d hybridization. In one embodiment, the surface is corrugated/rough, thereby promoting said π-d hybridization. In one embodiment, the corrugated surface provides reactivity of said surface toward said conjugated molecule(s). In one embodiment, the electrode comprises Ni, and the conjugated molecule is an acene molecule. In one embodiment, the acene molecule comprises or consists of benzene.

In one embodiment, the device further comprises a second electrode, said second electrode comprises a surface, said surface at least partially facing said first electrode. In one embodiment, one end of said conjugated molecule is attached to said surface of said first electrode and another end of said conjugated molecule is attached to a surface of said second electrode. In one embodiment, the surface of said second electrode comprises a ferromagnetic material, wherein said attachment of said conjugated molecule to said surface comprises coupling of said conjugated molecule to said surface via π-d hybridization between π molecular orbitals of said conjugated molecule and d orbitals of said ferromagnetic material. In one embodiment, the electrodes are configured as crossing wires with said conjugated molecule in between. In one embodiment, the conjugated molecule act as a transport medium between said electrodes, thereby increasing selectivity of spin transport between said electrodes, thus amplifying magnetic effects in said device. In one embodiment, this invention provides magneto-resistive devices as described herein above, configured and operable as an anisotropic magneto-resistance (AMR) device characterized by anisotropic magneto-resistance.

In one embodiment, this invention provides magneto-resistive devices as described herein above, wherein said surfaces of said first and second electrodes comprise a ferromagnetic material and wherein said device further comprises a non-magnetic metal located between said surfaces, wherein at least one of said surfaces is chemically modified by said conjugated molecule, such that said device is a giant magneto-resistive (GMR) device.

In one embodiment, this invention provides magneto-resistive devices as described herein above, wherein said surfaces of said first and second electrodes comprise a ferromagnetic material and wherein said device further comprises a dielectric material located between said surfaces, wherein at least one of said surfaces is chemically modified by said conjugated molecule, such that said device is a tunneling magneto-resistive (TMR) device.

In one embodiment, this invention provides magneto-resistive devices as described herein above, wherein the devices comprise an array of junctions, each formed by a layer of conjugated molecules bridging ferromagnetic surfaces of two electrodes, wherein said conjugated molecule is coupled to the ferromagnetic surface of at least one of the electrodes via π-d hybridization of π molecular orbitals and d orbitals of the ferromagnetic material of the electrode.

In one embodiment, this invention provides a layered magneto-resistive device comprising:
  a first magnetic material layer;
  a molecular layer comprising a first surface and a second surface; and
  a second magnetic material layer;
wherein said first surface of said molecular layer is in contact with said first magnetic material layer and wherein said second surface of said molecular layer is in contact with said second magnetic material layer, such that:
  molecules of said first surface are coupled to said first magnetic material layer via π-d hybridization between π molecular orbitals and d orbitals of said magnetic material; and
  molecules of said second surface are coupled to said second magnetic material layer via π-d hybridization between π molecular orbitals and d orbitals of said magnetic material.

In one embodiment, the organic conjugated molecules comprise oligoacenes. In one embodiment, the organic conjugated molecules comprise benzene. In one embodiment, the magnetic material is ferromagnetic or antiferromagnetic. In one embodiment, the device is operated at room temperature. In one embodiment, the thickness of said molecular layer ranges between 0.5 nm and 100 nm. In one embodiment, the device is anisotropic-magneto-resistance (AMR) device. In one embodiment, the magneto-conductance ranges between 10% and 300%. In one embodiment, the magneto-conductance ranges between 100% and 250%.

In one embodiment, the ferromagnetic material comprises Fe, Ni, Co, oxides thereof, alloys thereof and combinations thereof.

In one embodiment, this invention provides a layered magneto-resistive device comprising:
  a first magnetic material layer;
  a non-magnetic metal layer;
  a molecular layer comprising a first surface and a second surface; and
  a second magnetic material layer;
wherein said first surface of said molecular layer is in contact with said non-magnetic metal layer and wherein said second surface of said molecular layer is in contact with said second magnetic material layer, such that:
  molecules of said first surface are coupled to said non-magnetic metal layer; and
  molecules of said second surface are coupled to said second magnetic material layer via π-d hybridization between π molecular orbitals and d orbitals of said magnetic material.

In one embodiment, the organic conjugated molecules comprise oligoacenes. In one embodiment, the organic conjugated molecules comprise benzene. In one embodiment, the magnetic material is ferromagnetic or antiferromagnetic. In one embodiment, the device is operated at room temperature. In one embodiment, the thickness of said molecular layer ranges between 0.5 nm and 100 nm. In one embodiment, the device is giant-magneto-resistance (GMR) device. In one embodiment, the magneto-conductance ranges between 10% and 1000%. In one embodiment, the magneto-conductance ranges between 100% and 250%. In one embodiment, the ferromagnetic material comprises Fe, Ni, Co, oxides thereof, alloys thereof and combinations thereof.

In one embodiment, the non-magnetic metal comprises Cu, Ta, Ru, Ag, Ti, Cr, or alloys thereof.

In one embodiment, this invention provides a layered magneto-resistive device comprising:
  a first magnetic material layer;
  a dielectric layer;
  a molecular layer comprising a first surface and a second surface; and
  a second magnetic material layer;
wherein said first surface of said molecular layer is in contact with said dielectric layer and wherein said second surface of said molecular layer is in contact with said second magnetic material layer, such that:
  molecules of said first surface are coupled to said dielectric; and
  molecules of said second surface are coupled to said second magnetic material layer via π-d hybridization between π molecular orbitals and d orbitals of said magnetic material.

In one embodiment, the organic conjugated molecules comprise oligoacenes. In one embodiment, the organic conjugated molecules comprise benzene. In one embodiment, the magnetic material is ferromagnetic or antiferromagnetic. In one embodiment, the device is operated at room temperature. In one embodiment, the thickness of said molecular layer ranges between 0.5 nm and 100 nm. In one embodiment, the device is tunneling-magneto-resistance (TMR) device. In one embodiment, the magneto-conductance ranges between 10% and 1000%. In one embodiment, the increase in the magneto-conductance ranges between 100% and 250%. In one embodiment, the ferromagnetic material comprises Fe, Ni, Co, oxides thereof, alloys thereof and combinations thereof. In one embodiment, the dielectric comprises metal-oxides, silicon oxide, polymers, insulating molecules (e.g. alkanes) or a combination thereof.

In one embodiment, devices of this invention comprise a repeated layered structure. According to this aspect and in one embodiment, AMR devices of this invention comprise an (M-O-M-O-M-O-M) structure wherein "M" represents a magnetic metal layer and "O" represents an organic molecule layer. The number of "M" and "O" layers can be any suitable number according to embodiments of this invention.

According to this aspect and in one embodiment, for an AMR device, where all the magnetic layers are magnetized in the same direction such device may have an advantage as the magnetoresistance enhancement is based on an interface effect which is sensitive to the interface geometry. Increasing the number of interfaces may increase the probability to achieve high magnetoresistance ratio. In one embodiment, repeated layered structures of this invention further comprise non-magnetic metal layers or dielectric layers in between some of the magnetic metal and organic layers thus forming a repeated layered GMR or TMR devices. In one embodiment, repeated layered structures of this invention may comprise two or more M-O layer units. In one embodiment, repeated layered structures of this invention may comprise two or more M-D-O layer units where "D" represents a dielectric layer. In one embodiment, repeated layered structures of this invention may comprise two or more M-N-O layer units where "N" represents a non-magnetic metal layer.

In one embodiment, in TMR layered devices of this invention, one surface of the dielectric layer is in contact with the molecular layer and another surface of the dielectric layer is in contact with the magnetic metal layer. In one embodiment, in TMR layered devices of this invention, one surface of the dielectric layer is in contact with one molecular layer and another surface of the dielectric layer is in contact with another molecular layer.

In one embodiment, in GMR layered devices of this invention, one surface of the non-magnetic metal layer is in contact with the molecular layer and another surface of the non-magnetic metal layer is in contact with the magnetic metal layer. In one embodiment, in TMR layered devices of this invention, one surface of the non-magnetic metal layer is in contact with one molecular layer and another surface of the non-magnetic metal layer is in contact with another molecular layer.

In one embodiment, layered devices of this invention comprise three layers: a first magnetic metal layer, a molecular layer (also functioning as a dielectric) and a second magnetic metal layer. In one embodiment, layered devices of this invention comprise five layers: a first magnetic metal layer, a first molecular layer, a dielectric layer or a non-magnetic metal layer, a second molecular layer and a second magnetic metal layer.

Embodiments described for the layered structures shown in FIGS. 1A-1C are also applicable to the GMR and TMR layered structures described herein above in some embodiments.

Methods of Producing

In one embodiment, devices of this invention comprise a structure comprising a molecule or a collection of molecule spanning two magnetic material surfaces. In one embodiment such structure is formed by the mechanical break junction technique as illustrated in FIG. 2 and in the corresponding description. In other embodiments, structures of this invention comprising a molecule or a collection of molecules between two magnetic materials are formed by one or more of the following methods: using the electromigration technique, by deposition from solution (e.g. elecrtrodeposition or electroless deposition, saturation, centrifugation), by vapor phase deposition/evaporation methods such PVD, CVD, e-beam evaporation or resistive heating evaporation. In other embodiments, the structures are formed by methods including a movable tip and a surface such as STM and AFM. In one embodiment structures of this invention utilize self-assembly of molecules from solution or from a vapor phase onto a surface of a magnetic material. In another embodiment, e-beam lithography involving various exposure parameters is used to form thin junctions between two magnetic materials, junctions into which a molecule (or a set of molecules) can be incorporated. Methods involving stamping, molding, soft lithography, UV and e-beam lithography and related methods can be used to pattern/form the molecular layer and any other layer in devices of this invention. Methods involving wet etching, dry etching, resist application and lift-off, spin-coating, drop casting and relevant methods can be used to pattern/form the molecular layer and any other layer in devices of this invention, Any other method can be used to form structures of this invention as known to the skilled artisan.

In order to roughen the ferromagnetic surfaces (and other intermediate surfaces as needed) before adsorption of the molecules, various techniques may be employed. The mechanical break junction method, wet or dry etching, other mechanical and chemical surface roughening methods, electrochemical methods, temperature variations, sputtering, evaporation under certain conditions (e.g. evaporation rate/substrate temperature) and any other method as known to a person of ordinary skill in the art.

All the methods described above for a molecule or a collection of molecules assembled between two magnetic materials is also applicable for structures comprising a molecule or a collection of molecules between one magnetic material and one non-magnetic material (e.g. a non-magnetic metal, a dielectric etc.).

In one embodiment, layered magneto-resistive devices of this invention are formed as follows:
  a first magnetic metallic layer is provided or is formed by one of the methods described herein above (e.g. evaporation/deposition).
  a molecular layer (a mono-layer, bilayer or multilayer) is assembled on top of the magnetic metal layer by one of the methods described herein above (e.g. self-assembly from solution/vapor phase, spin-coating, deposition from solution by solvent evaporation).
  Optionally an intermediate layer of non-magnetic metal or dielectric is formed on top of the molecular layer by one of the methods described herein above (e.g. evaporation/deposition).
  a second magnetic metallic layer is provided or is formed by one of the methods described herein above (e.g. evaporation/deposition), such that the magnetic metallic layer is assembled on top of the molecular layer or on top of the optional non-magnetic metal or dielectric layers, such that the magnetic metal layer is in contact with the molecular layer (or with the non-magnetic metal/dielectric).

In one embodiment, a second molecular layer is assembled on top of the non-magnetic metal or on top of the dielectric layer in embodiments of this invention. Such layer is in contact with the second magnetic layer.

In one embodiment, the molecular layer comprises a collection of molecules arranged on the surface of the magnetic layer such that the first layer of molecules on the magnetic layer comprises molecules arranged side-by-side on the magnetic layer. The molecular layer according to this aspect differs from a system comprising a single-molecule between two magnetic contacts. Accordingly, and in one embodiment, devices of this invention are not single-molecule devices.

In one embodiment, such layered devices are described as thin film devices. The layers (some or all of the layers) are considered thin films.

In other embodiments, as described herein above, devices of this invention are single-molecule devices and accordingly, such devices comprise a single-molecule residing between two metallic contacts (or between a metallic contact and a dielectric).

Other devices comprise a few molecules. Such devices differ from devices comprising a molecular layer as the area occupied by the molecules is very small in some embodiments and is not considered a layer.

In one embodiment, layered devices of this invention are visualized in FIG. 1. In one embodiment, layered molecular structures are ordered. In another embodiment, layered molecular structures are disordered. In another embodiment, layered molecular structures are generally ordered but comprise some disordered domains Such layers are partially-disordered in one embodiment.

In one embodiment, the size of the surface (length×width) of the magnetic metal layer is larger than the nanometer range (e.g. the surface size ranges between 1 μm and 1 cm). In one embodiment, the magnetic metal layer is not a quantum dot. In other embodiments, the surface dimensions of the magnetic metal layers are in the nanometer range.

In one embodiment, devices of the invention further comprise electrical contacts. Methods of formation/construction of electrical contacts are known in the art.

Uses/Methods of Use

In one embodiment, devices of this invention are used in/as magnetic switches. In one embodiment, devices of this invention are used in/as magnetic sensors. In one embodiment, devices of this invention are used in spintronic devices. In one embodiment, devices of this invention are used in memory devices.

Definitions

Unpassivated is a surface of a material not coated by a passivation layer. In one embodiment, unpassivated surface or material means a bare material. In one embodiment, unpassivated is non-passivated. Unpassivated means that the surface is not "passive". In one embodiment, unpassivated means active. In one embodiment, unpassivated means active toward bonding with the conjugated molecules of the invention. Passivated means coated by a different material to lessen reactivity of the surface with respect to other materials that comes into contact with the surface. A passive surface is less affected by environmental factors such as air and water. Passivation of a material involves the formation of a shielding outer-layer on the surface of the material, which can be applied using a physical or a chemical process (coating, deposition, adsorption, oxidation etc.). The passivation layer (shielding layer) can be prepared using a deliberate process and/or it can be formed spontaneously (e.g. oxidation of the surface in air). Passivation provides a protective layer on the surface of the material. In some embodiments, unpassivated means uncoated material. Passivating the surface, for example by oxidation will prohibit the desired chemistry that promotes pi-d hybridization as described herein above. Impurities and contaminations on a surface renders the surface passivated in some embodiments.

Organic molecules are generally considered as molecules comprising carbon and hydrogen (and may contain other elements as well). In one embodiment, an organic compound (organic molecule) is any compound that contains a significant amount of carbon. In some embodiments, organic compounds contain one or more C—H bonds. In some embodiments, organic compounds contain C—C bonds by definition. According to other embodiments, an organic molecule is a molecule comprising carbon. In one embodiment, at least some of the bonds between atoms in an organic molecule are covalent bonds between non-metal elements.

Conjugated molecules are molecules comprising overlapping p-orbitals. Conjugated molecules comprise alternating single and double (or multiple) bonds in the molecular structure. Benzene is one example of a conjugated molecule.

In one embodiment, corrugated means comprising a series of parallel ridges and furrows. In one embodiment, corrugated means rough. In one embodiment, roughness of a surface is the texture or the topography of the surface. Rough surfaces are non-flat surfaces (microscopically). In one embodiment, corrugated is not flat. In one embodiment, roughness of a surface is measured by profile roughness Ra. For example, Ra is the average of the absolute values of the profile height deviations from the mean line, recorded within a certain length. Ra is the average of a set of individual measurements of surface peaks and valleys.

Coupled to, means associated with, attached to, bonded to, placed at close proximity to, influencing and being influenced by, related, linked or connected to the entity to which it is coupled. All such relationships between coupled materials may include chemical and physical interactions between the coupled materials.

Conductance is the reciprocal of resistance. It is measured generally in units of S (siemens). One siemens is equal to the reciprocal of one ohm. Conductance may be measured by applying voltage to a system/component and measuring current, thus extracting the resistance and the conductance. Conductance may be measured, stated or defined by $G_0$ and corresponding values as defined herein above.

Break junction is the term used to describe a small junction formed between two electrical contacts. The name break-junction refers to the way of making of the junction which involves breaking a very thin wire or constriction using mechanical means (usually by bending).

$Go=2e^2/h \cong 1/12.9$ kOhm, is the conductance quantum, where e is the electronic charge and h is Plank's constant; $G_{min}$ is the minimal conductance achieved when the magnetization is aligned with the current direction either parallel or antiparallel. In the specific case here $G_{min}$ is the minimal conductance achieved at $|B|=0.5$ Tesla (FIGS. 3A-3C) and $|B|=0.3$ Tesla (FIG. 3E).

In some embodiments a magneto-resistance structure is a magneto-resistance device. In other embodiments, a magneto resistance structure is part of a magneto resistance device. Magneto-resistance devices of this invention comprise magneto-resistance structures of the invention according to some embodiments.

In one embodiment, insulating means: that acts as a tunneling barrier. A thin film of an insulator such as a metal oxide in some embodiments.

In one embodiment, for AMR devices, if the conductance is at the tunneling regime it would have been regarded as tunneling AMR and not TMR.

TMR– For TMR, an asymmetric junction is required in order to switch the magnetization of the two electrodes either parallel or antiparallel to each other.

In one embodiment, "acene" is a family of molecules comprising the basic unit of a benzene ring. The acenes (and oligoacenes/polyacenes) include benzene and a series of molecules comprising fused benzene rings. Naphthalene and anthracene are members of the acene family. Acene/oligoacene/polyacene molecules are conjugated organic molecules.

Changes in conductance in response to magnetic field are termed magnetoconductance or magneto-conductance.

In one embodiment, the surface of the magnetic metal is microscopically rough. In one embodiment, microscopical roughness cannot be seen by the naked eye.

In one embodiment, microscopically-rough means that the roughness can be imaged/detected/determined using microscopy techniques. In another embodiment, microscopical roughness is too fine and cannot be imaged/detected/determined using current microscopy techniques. However, such microscopical roughness exists and affects the surface properties. In one embodiment, in microscopically-rough surfaces, the roughness is an atomic-level roughness. Atomic-level roughness may include atomic steps, atomic protrusions and atoms residing on an atomically-flat surface. In one embodiment, microscopically rough surface may appear flat to the naked eye. Accordingly, a surface can be macroscopically flat and microscopically rough.

In one embodiment, the magneto-resistance values noted in % herein above are magneto-conductance values (%).

In one embodiment, the term "a" or "one" or "an" refers to at least one. In one embodiment the phrase "two or more" may be of any denomination, which will suit a particular purpose. In one embodiment, "about" or "approximately" may comprise a deviance from the indicated term of +1%, or in some embodiments, −1%, or in some embodiments, ±2.5%, or in some embodiments, ±5%, or in some embodiments, ±7.5%, or in some embodiments, ±10%, or in some embodiments, ±15%, or in some embodiments, ±20%, or in some embodiments, ±25%.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

EXAMPLES

Example 1

Fabrication of a Magneto-Resistance Device

In this specific and not limiting example, the devices were fabricated on a phosphor-bronze substrate 22 (see FIG. 2B), spin coated with a 2-micron thick dielectric polyimide layer. Contact pads and leads are patterned using photo-lithography and e-beam evaporation of a 10 nm thick chrome layer followed by an 80 nm thick gold layer. The constriction was patterned using e-beam lithography followed by e-beam evaporation of an 80 nm thick nickel layer (electrode layer). The polyimide layer below the constriction was then etched using inductively coupled plasma to form a freely suspended region of about 320 nm. The device was contacted with copper wires and was then mounted into a vacuum chamber equipped with a three-point bending setup and cooled to 5 degrees Kelvin. The constriction was narrowed to form an atomic junction, followed by complete breaking, by bending the substrate using a combination of a screw-nut mechanism for rough adjustments and a piezo-element for fine-tuning. The conductance of the junction was measured both using a conventional lock-in current-bias and voltage bias schemes.

In these experiments, benzene molecules (Sigma Aldrich, Anhydrous, 99.8%) were introduced to the junction using a heated vacuum tube, connecting a benzene reservoir held at room temperature to a funnel right above the junction. The benzene was further purified in-situ by several freeze-pump-thaw cycles before admission of molecules to the junction.

Subsequent measurements of different molecular configurations were performed by closing the junction to have a conductance of 1-2 $G_0$ and avoiding deformation of the metallic atomic tips. To form different realizations of molecular junctions, the junction was closed to conductance larger than 50 $G_0$ and re-opened. Then, the magneto-conductance of the new junction was characterized and the admission of benzene molecules was repeated.

Example 2

Measurements of Conductance Vs. Magnetic Field Along the Axis of a Junction

Reference is made to FIGS. 3A to 3E illustrating relative conductance of the magneto-resistive structure as a function of the magnetic field applied along the axis of the junction in different stages of contact stretching.

As a first step (FIG. 3A), the nickel contact was characterized by measuring conductance as a function of a magnetic field applied along the axis of the junction before breaking the micro-scale constriction between the electrodes. In this high conductance regime of the point contact (conductance of G=43.26 $G_0$), the observed relative magneto-conductance, defined as $\Delta G/G_{min}=(G-G_{min})/G_{min}$, is below 2%, as expected from the usual AMR effect for bulk nickel (as defined above: $G_{min}$ is the minimal conductance practically measured at |B|=0.5 Tesla in parallel to the junction axis). Further stretching of the junction resulted in a gradual breaking of the constriction and a decrease of conductance until an atomic contact was reached (G=1.36 $G_0$). Repeating the measurements for an atomic contact revealed that the magneto-conductance had increased to 12% (FIG. 3B), which is in correspondence with previous measurements. Additional stretching resulted in breaking of the contact and the formation of a tunnel junction (G<<1 $G_0$). Measurements of the bare Ni junction in the tunneling regime have shown no change in relative magneto-conductance up to a conductance of G~0.5 $G_0$. Below this conductance the magneto-conductance decreases and eventually disappears. Hence, in the devices configured according to the invention, unwanted magneto-strictive effects in which the junction structure is modified by the external magnetic field, can be neglected within the low magnetic field regime applied in the experiment (B<0.5 T, where T denotes Tesla).

In the next step, benzene molecules were introduced to the junction. After the introduction of benzene, magneto-conductance measurements of the junction at G=0.42 $G_0$ revealed a relative conductance change of over 200% with application of magnetic field (FIG. 3C). Subsequent measurements at different molecular configurations were performed by closing the junction to 1-2 $G_0$ to avoid deformation of the metallic atomic tips and reopening the junction. As shown in FIGS. 3A to 3C, the conductance drops with the increase of the magnetic field along the axis. From this behavior and together with control measurements performed along additional axes of the junction, it is evident that in the absence of an external magnetic field the spontaneous magnetization of the constriction region is in-plane and perpendicular to the axis of the junction, as marked by $M_A$ in FIG. 3D. Application of an external axial magnetic field results in magnetization along the axis of the junction, as marked by $M_B$ in FIG. 3D. As noted above, it was found that the spontaneous magnetization of the samples shown in FIGS. 3A-3C (at zero magnetic field) is aligned perpendicular to the junction axis and in its plan. Accordingly, sweeping the magnetic field along the junction axis (FIGS. 3A-3C) is equivalent to rotating the magnetization in 180 degrees as in FIG. 3E.

Example 3

Measurements of Differential Conductance vs. Bias Voltage

Figure 4A:
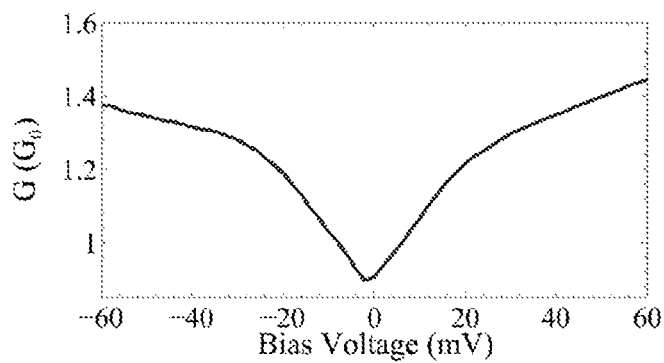
FIGS. 4A and 4B illustrate inelastic electron spectroscopy measurements before molecule introduction (FIG. 4A) and after molecule introduction (FIG. 4B)
Figure 4B:
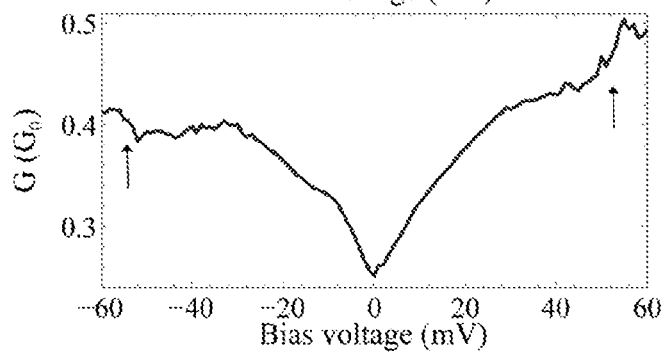

In order to verify that the substantial amplification of magneto-conductance results from transport through the conjugated molecule bridging the gap between the electrodes, the inventors performed inelastic electron spectroscopy measurements on the studied junction to inspect the signature of molecular vibrations. In this connection, reference is made to FIGS. 4A and 4B exemplifying the measured differential conductance as a function of bias voltage before and after the introduction of the molecules. As shown in the figures, in both cases a large increase of differential conductance with bias voltage is observed. This background is attributed to excitation of phonons and magnons in the metallic electrodes, combined with variations in the electronic density of states of the point contact. However, after molecule admission (FIG. 4B), conductance steps around a bias voltage of 53±3 mV are observed. Similar features were previously shown to arise from vibration-induced electron scattering of benzene in non-ferromagnetic molecular junctions (platinum-benzene-platinum junctions), and are a clear indication of the participation of the benzene molecule in the transport process.

Example 4

Measurements of Conductance Vs. Magnetic Field Orientation

To further establish that the observed effect is due to the AMR effect, conductance measurements were performed while rotating the magnetic field around the sample. The amplitude of the applied magnetic field was 0.3 T, which is above the field required to saturate the magnetization of either one of the electrodes. The magnetic field was rotated in the plane of the junction, and the angle was defined relatively to the junction axis (FIG. 3D). As shown in FIG. 3E, there is a clear dependence on the field angle, with an increase in conductance when the magnetic field is at an angle of 50<θ<130 with respect to the junction axis. This behavior is typical to AMR effect in atomic-scale junctions.

Example 5

Measurements of Conductance vs. Electrode Spacing

The AMR amplification can be tuned by changing the distance between the electrodes. Reference is made to FIGS. 5A and 5B presenting magneto-conductance measurements performed during a stretching sequence of a specific molecular junction. More specifically, these figures illustrate a change of amplification with the molecular configuration. FIG. 5A shows the magneto-conductance measurements taken repeatedly on a specific molecular junction during the elongation of the junction; base conductance changed with inter-electrode distance due to the change in the molecular configuration. FIG. 5B shows relative magneto-conductance obtained from the same stretching series shown in FIG. 5A, the numbers in FIG. 5B mark the relevant curves shown in FIG. 5A. As shown, by increasing the inter-electrode distance and thus decreasing the overall conductance, the magneto-conductance effect is enhanced until a conductance of $G=0.4\ G_0$ is reached, after which the tendency is reversed. Such non-monotonic dependence on the molecular configuration was repeated in several junctions and is an additional proof for the contribution of the molecule to the transport through the junction. These results indicate that the AMR effect could be optimized by changing the molecular configuration in the junction.

What is claimed is:

1. A magneto-resistive device comprising at least one electrode, said electrode comprising a surface, wherein said surface comprises a ferromagnetic material, wherein said surface is attached to at least one conjugated molecule, such that said molecule is coupled to said surface via π-d hybridization between π molecular orbitals and d orbitals of the ferromagnetic material, wherein said surface is corrugated such that it contains under-coordinated atoms.

2. The magneto-resistive device of claim 1, wherein said surface is unpassivated.

3. The magneto-resistive device of claim 1, wherein said electrode comprises Ni, and said conjugated molecules comprise acene or oligoacene molecules.

4. The magneto-resistive device of claim 1, wherein said device further comprises a second electrode, said second electrode comprises a surface, said surface at least partially facing said first electrode.

5. The magneto-resistive device of claim 4, wherein one end of said conjugated molecule is attached to said surface of said first electrode and another end of said conjugated molecule is attached to a surface of said second electrode.

6. The magneto-resistive device of claim 5, wherein said surface of said second electrode comprises a ferromagnetic material, wherein said attachment of said conjugated molecule to said surface comprises coupling of said conjugated molecule to said surface via π-d hybridization between π molecular orbitals of said conjugated molecule and d orbitals of said ferromagnetic material.

7. The magneto-resistive device of claim 4, wherein said electrodes are configured as crossing wires with said conjugated molecule in between.

8. The magneto-resistive device of claim 4, wherein said conjugated molecule act as a transport medium between said electrodes, thereby increasing selectivity of spin transport between said electrodes, thus amplifying magnetic effects in said device.

9. The magneto-resistive device of claim 4, wherein said surfaces of said first and second electrodes comprise a ferromagnetic material and wherein said device further comprises a non-magnetic metal located between said surfaces, such that said device is a giant magneto-resistive (GMR) device.

10. The magneto-resistive device of claim 4, wherein said surfaces of said first and second electrodes comprise a ferromagnetic material and wherein said device further comprises a dielectric material located between said surfaces, such that said device is a tunneling magneto-resistive (TMR) device.

11. The magneto-resistive device of claim 1, configured and operable as an anisotropic magneto-resistance (AMR) device characterized by anisotropic magneto-resistance.

12. The magneto-resistive device of claim 1, wherein said surface is attached to between 1-10 conjugated molecules.

13. The magneto-resistive device of claim 12, wherein said surface is attached to 1 conjugated molecule.

14. A magnetic memory device, comprising an array of junctions, each formed by a layer of conjugated molecules bridging ferromagnetic surfaces of two electrodes, wherein said conjugated molecule is coupled to the ferromagnetic surface of at least one of the electrodes via π-d hybridization of π molecular orbitals and d orbitals of the ferromagnetic material of said electrode, and wherein said surface of at least one of the electrodes is corrugated such that it contains under-coordinated atoms.

15. A layered magneto-resistive device comprising:
a first magnetic material layer;
a molecular layer comprising a first surface and a second surface; and
a second magnetic material layer;
wherein said first surface of said molecular layer is in contact with said first magnetic material layer and wherein said second surface of said molecular layer is in contact with said second magnetic material layer, such that:
molecules of said first surface are coupled to said first magnetic material layer via π-d hybridization between π molecular orbitals and d orbitals of said magnetic material; and
molecules of said second surface are coupled to said second magnetic material layer via π-d hybridization between π molecular orbitals and d orbitals of said second magnetic material, and wherein a surface of said first magnetic material layer, of said second magnetic material layer or a combination thereof, coupled to said molecules, is corrugated such that it contains under-coordinated atoms.

16. The device of claim 15, wherein said organic conjugated molecules comprise acene or oligoacenes.

17. The device of claim 15, wherein said magnetic material is ferromagnetic or antiferromagnetic.

18. The device of claim 15, wherein the thickness of said molecular layer ranges between 0.5 nm and 100 nm.

19. The device of claim 15, wherein said device is anisotropic-magneto-resistance (AMR) device.

20. The device of claim 19, wherein the magneto-conductance ranges between 10% and 300%.

21. The device of claim 16, wherein said ferromagnetic material comprises Fe, Ni, Co, oxides thereof, alloys thereof and combinations thereof.

22. A layered magneto-resistive device comprising:
a first magnetic material layer;
a non-magnetic metal layer;
a molecular layer comprising a first surface and a second surface; and
a second magnetic material layer;
wherein said first surface of said molecular layer is in contact with said non-magnetic metal layer and wherein said second surface of said molecular layer is in contact with said second magnetic material layer, such that:
molecules of said first surface are coupled to said non-magnetic metal layer; and
molecules of said second surface are coupled to said second magnetic material layer via π-d hybridization between π molecular orbitals and d orbitals of said magnetic material,
and wherein a surface of said second magnetic material layer, coupled to said molecules, is corrugated such that it contains under-coordinated atoms.

23. The device of claim 22, wherein said organic conjugated molecules comprise acene or oligoacenes.

24. The device of claim 22, wherein said magnetic material is ferromagnetic or antiferromagnetic.

25. The device of claim 22, wherein the thickness of said molecular layer ranges between 0.5 nm and 100 nm.

26. The device of claim 22 wherein said device is giant-magneto-resistance (GMR) device.

27. The device of claim 26, wherein the magneto-conductance ranges between 10% and 1000%.

28. The device of claim 22, wherein said ferromagnetic material comprises Fe, Ni, Co, oxides thereof, alloys thereof and combinations thereof.

29. The device of claim 22, wherein said non-magnetic metal comprises Cu, Ta, Ru, Ag, Ti, Cr, or alloys thereof.

30. A layered magneto-resistive device comprising:
a first magnetic material layer;
a dielectric layer;
a molecular layer comprising a first surface and a second surface; and
a second magnetic material layer;
wherein said first surface of said molecular layer is in contact with said dielectric layer and wherein said second surface of said molecular layer is in contact with said second magnetic material layer, such that:
molecules of said first surface are coupled to said dielectric; and
molecules of said second surface are coupled to said second magnetic material layer via π-d hybridization between π molecular orbitals and d orbitals of said magnetic material,
and wherein a surface of said second magnetic material layer, coupled to said molecules, is corrugated such that it contains under-coordinated atoms.

31. The device of claim 30, wherein said organic conjugated molecules comprise acene or oligoacenes.

32. The device of claim 30, wherein said magnetic material is ferromagnetic or antiferromagnetic.

33. The device of claim 30, wherein the thickness of said molecular layer ranges between 0.5 nm and 100 nm.

34. The device of claim 30, wherein said device is tunneling-magneto-resistance (TMR) device.

35. The device of claim 34, wherein the magneto-conductance ranges between 10% and 1000%.

36. The device of claim 30, wherein said ferromagnetic material comprises Fe, Ni, Co, oxides thereof, alloys thereof and combinations thereof.

37. The device of claim 30, wherein said dielectric comprises metal-oxides, silicon oxide, polymers, insulating molecules (e.g. alkanes) or a combination thereof.

* * * * *